United States Patent [19]

Thornton et al.

[11] Patent Number: 4,786,918

[45] Date of Patent: Nov. 22, 1988

[54] INCOHERENT, OPTICALLY UNCOUPLED LASER ARRAYS FOR ELECTRO-OPTIC LINE MODULATORS AND LINE PRINTERS

[75] Inventors: Robert L. Thornton, East Palo Alto; Henry W. Sang, Jr., Santa Clara; Thomas L. Paoli, Los Altos; Robert D. Burnham, Palo Alto, all of Calif.

[73] Assignee: Xerox Corporation, Stamford, Conn.

[21] Appl. No.: 106,014

[22] Filed: Oct. 1, 1987

Related U.S. Application Data

[63] Continuation of Ser. No. 808,197, Dec. 19, 1985, abandoned.

[51] Int. Cl.[4] ............................ G01D 9/42; H01S 3/19
[52] U.S. Cl. ...................................... 346/108; 372/46; 372/48; 354/5
[58] Field of Search ................ 346/108, 107 R, 76 L, 346/160; 372/46, 48, 50; 354/5, 12

[56] References Cited

U.S. PATENT DOCUMENTS

| | | |
|---|---|---|
| 3,701,044 | 10/1972 | Paoli et al. . |
| 3,936,322 | 2/1976 | Blum et al. . |
| 4,069,463 | 1/1978 | McGroddy et al. . |
| 4,280,108 | 7/1981 | Scifres et al. . |
| 4,281,904 | 8/1981 | Sprague et al. . |
| 4,318,059 | 3/1982 | Lang et al. . |
| 4,367,925 | 1/1983 | Sprague et al. . |
| 4,369,457 | 1/1983 | Sprague . |
| 4,370,029 | 1/1983 | Sprague et al. . |
| 4,437,106 | 3/1984 | Sprague . |
| 4,450,459 | 5/1984 | Turner et al. . |
| 4,455,562 | 6/1984 | Dolan et al. . |
| 4,480,899 | 11/1984 | Sprague . |
| 4,483,596 | 11/1984 | Marshall . |
| 4,490,611 | 12/1984 | Sekimoto .................. 346/107 R |
| 4,520,471 | 5/1985 | Carlin . |
| 4,603,421 | 7/1986 | Scifres ......................... 372/46 |
| 4,624,000 | 11/1986 | Streifer ....................... 372/48 |
| 4,706,255 | 11/1987 | Thornton ...................... 372/50 |

OTHER PUBLICATIONS

"Phase-Locked Semiconductor Laser Array", D. R. Scifres et al., Applied Physics Letters; vol. 33(12), pp. 1015-1017 (12/15/78).

*Primary Examiner*—E. A. Goldberg
*Assistant Examiner*—Mark Reinhart
*Attorney, Agent, or Firm*—W. Douglas Carothers, Jr.

[57] ABSTRACT

An incoherent, optically uncoupled laser array for an electro-optic line modulator or a line printer or the like and comprising a plurality of spatial laser emitters characterized by having high power density and a uniform far field emission pattern. Structural means is provided in the array to permit the spacing of the emitters sufficiently close to provide a uniform far field emission pattern without permitting phaselocking between adjacent emitters of the array. The structural means may comprise geometric lateral and diagonal displacement of adjacent optical cavities of the laser elements. Alternatively, the structural means may comprise a plurality of spatially disposed isolation regions extending across the laser array and extending into the laser array a distance sufficient to optically isolate the optical cavities of the laser elements from one another and prevent optical coupling between adjacent laser elements. The spatial isolation regions may be formed into the fabricated laser array using impurity induced disordering (IID).

5 Claims, 5 Drawing Sheets

INCOHERENT, OPTICALLY UNCOUPLED LASER ARRAYS FOR ELECTRO-OPTIC LINE MODULATORS AND LINE PRINTERS

This is a continuation of application Ser. No. 808,197, filed Dec. 12, 1985, now abandoned.

BACKGROUND OF THE INVENTION

This invention relates to incoherent nonphaselocked laser arrays and in particular nonphaselocked or optically uncoupled laser arrays having a broad uniform far field with high intensity which are highly adaptable for use as illuminating sources with electro-optic line modulators and electro-optic line printers.

In the prior art, semiconductor lasers and LEDs have been employed as a light source to produce an image on a photosensitive medium such as a xerographic photoreceptor used in a xerograhic printer. In this kind of application, there is a need for uniformity of the intensity of light in the image as well as sufficient intensity of the light emitted. Further, if LEDs have to be utilized, it is necessary to provide a full width array of LEDs, one per picture element or pixel so that a line of light can be formed for discharge of the photoreceptor in an imagewise manner. Usually a plurality of light emitting device arrays are arranged in one or more rows and optical means is positioned between the photosensitive medium and the light source array to focus the light from the array sources to a single line on the surface of the photosensitive medium. The light sources are selectively turned on and off to effect line-by-line exposure of the moving photosensitive medium.

Semiconductor lasers have also been used in the part as such light sources for rotating polygon scanned printers because of their high intensity in a focussed spot. They have not, however, been totally best suited for application in electro-optic line printers due to inadequate power and inadequate uniformity of light intensity. In particular, high-power coherent laser sources possess a far field pattern containing regions of high intensity and of low intensity in the single beam far field, i.e., the far field pattern is not uniform. Such a variation in intensity across the beam output is not desired because the line exposure on the photosensitive medium will not be uniform. For this and other reasons, LEDs have been more favored as a light source for electro-optic line printers because they may be designed to provide a light output of monotonically varying intensity with very short coherence length.

In some cases, LEDs in the past have not provided sufficient output power and intensity to accomplish in an efficient manner the task of exposing a charged an moving photosensitive medium. In addition, an LED is much less efficient than a laser. For this reason, LEDs as light sources for xerographic photoreceptor applications have lacked the output intensity level for good photoreceptor discharge and as a result, semiconductor lasers have been still favored in many cases as the light source for printer applications.

Beside the problem of sufficiency of LED intensity, the maintenance of light output uniformity among a plurality of LEDs as well as a multiple laser source, as alluded to above, is a recognized problem in the art. To insure that the intensity of the broad light emission from the array is uniform across an LED array, elaborate control systems have been designed to provide for light intensity uniformity as exemplified, for example, in U.S. Pat. No. 4,455,562. This patent utilizes a binary weighted duty cycle control to obtain substantial uniformity in the light emitted from each LED in the array of LEDs.

The highest power LEDs have been top emitter types, but they lack power density necessary for most printer applications, i.e., they lack from sufficient light density per aperture size.

A most recent advancement in the printer arts has been the concept of a total internal reflection (TIR) line modulator which is a solid state multigate light valve that may be used to address a photosensitive medium. The light TIR modulator comprises a crystal bar of electro-optic material with an array of interdigital electrodes deposited on one of its major surfaces, which electrodes, when electrically addressed, introduce or induce a periodic electric field into the bulk crystal. Each of the electrodes may be individually addressed by an electronic signal forming a signal pattern across the array. A broad or wide sheetlike beam of high intensity light is required for the line modulator. The beam is introduced into the crystal at an angle incident to the plane of the major surface incorporating the electrodes. An example of the line TIR modulator is disclosed in U.S. Pat. No. 4,281,904 to Robert A. Sprague et al.

To carry out the exposure process of the photosensitive medium, a sheetlike beam of light is transmitted through the electro-optic element of the TIR line modulation at a slight angle relative to the optical axis of the light to cause total internal reflection at the internal surface incorporating the electrode array. Successive sets of digital bits or analog samples, representing respective collections of picture elements or pixels for successive lines of an image, are sequentially applied to the electrode array. Localized electric bulk or fringe fields developed in the crystal in proximity to the TIR incidence of light modulate the light and change the phase front of the sheetlike light beam in imagewise configuration onto the charged photosensitive medium. Examples and teachings relative to electro-optic line printer applications may be found in U.S. Pat. Nos. 4,367,925; 4,369,457; 4,370,029; 4,437,106; 4,450,459; 4,480,899 and 4,483,596.

More recently, a super luminescent LED side-facet source has been developed for electro-optic line modulation and line printers which is characterized by having high output intensity and a uniform far field emission and optical means to collimate the far field emission in the tangential direction and focus the near field in the sagittal direction onto the modulator. The optical means comprises a first lens system to collect the light emitted from the LED source in both the tangential and sagittal directions and a second toric lens to collimate the light into a sheetlike beam in the tangential direction and to focus the light in the sagittal direction to a line image at the modulator. Imaging means is optically aligned between the modulator and the recording medium for imaging the modulator onto the recording medium of a line printer. In this connection, see U.S. patent application Ser. No. 719,595 filed Apr. 3, 1985, now U.S. Pat. No. 4,638,334 and U.S. patent application Ser. No. 874,982, filed June 16, 1986, a divisional application thereof.

Such an LED has nearly ideal characteristics as an optical source in printing applications utilizing multigate or electro-optic modulators because its radiation pattern is broad and varies monotonically in a predictable way without the sharp or irregular structure encountered with a diode laser array. In addition, the optical spectrum of the LED is sufficiently broad that optical interference effects are negligible. However, an LED inherently has a lower overall efficiency, e.g., conversion efficiency, than a diode laser since LED light is emitted in many different directions and also this requires that the LED of comparable output power operates at higher temperatures and higher input power than the diode laser source.

Thus, an optical source with the incoherence of an LED but the efficiency of a diode laser is desirable for line modulator and printer applications.

SUMMARY OF THE INVENTION

According to this invention, an incoherent diode laser array source is employed as a single solid state light source capable of providing a sheetlike, uniform and high intensity of light, the source comprising an array of closely spaced but uncoupled diode lasers. The essential ingredient is that the individual line or emitters of the laser array operate randomly phased with respect to each other, i.e., they are not sufficiently evanescently coupled to be in phase with each other. Thus, if each laser in the array oscillates independently of the other lasers, its optical phase and/or frequency will randomly drift and, as a result, permit optical interference to exist only within the beam of each individual laser rather than among or between the beams of adjacently positioned diode lasers of the array.

In order to produce an array of closely spaced lasers on a single chip which operate in an optically uncoupled manner, it is necessary to reduce the strength of the evanescent field extending from each laser cavity to adjacent laser cavities below a level required for accomplishing stable phase locking. This decoupling may be accomplished in several ways, First, for example, in a laser array of conventional gain-guided lasers, the individual laser elements must be separated by a relatively large distance, e.g., on the order of 50 μm or more, in order to achieve uncoupled operation. However, separation of the laser elements in the array by such a large distance leads to reduced efficiency due to the substantial amount of wasted current spread away from the active regions of the individual laser elements and the inability to efficiently collect the light in the far field for particular applications, such as electro-optic modulators and line printers. In addition, for large separations, the far field of the total array becomes nonuniform due to the decreased overlap of the far field patterns of the individual laser emitters, which would render this type of structure unsuitable for electro-optic line printers. In the case of an array of index guided lasers, the matter of far fielf separation would be better satisfied since the individual laser emitters need not be separated as far due to the tighter optical field confinement provided by the individual lasers of such an array. For both index-guided and gain-guided laser arrays, optical absorption can be introduced between the laser in order to eliminate the leakage of light from one laser into and adjacent laser waveguide or cavity at the cost of increased threshold and decreased efficiency. A closely spaced uncoupled array without optical absorption is the most desirable situation.

We propose to provide the necessary close spacing of the laser emitters of the array while sustaining uncoupled lasing operation by either diagonal displacement of the individual laser emitters or by forming regions of isolation formed between the laser cavities of the array using impurity induced disordering (IID). The desired end is to isolate the optical cavities of the individual cavities of the laser so that there will be no optical coupling between them.

Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
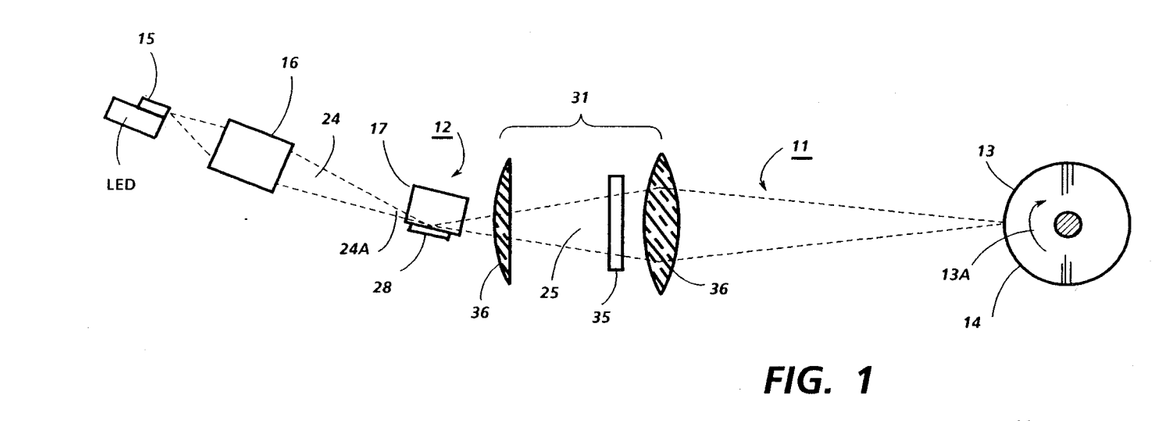
FIG. 1 is a schematic side view of an electro-optic line printer to carry out the present invention.
Figure 2:
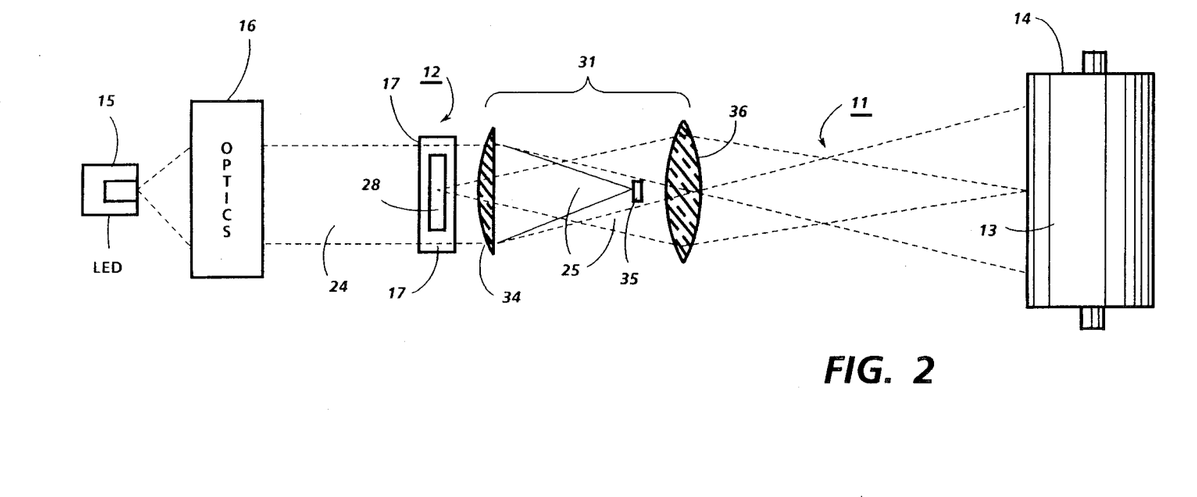
FIG. 2 is a plan view of the line printer shown in FIG. 1.

Referring to FIGS. 1 and 2, there is disclosed an electro-optic line printer 11 having a fringe field responsive multigate light valve or TIR line modulator 12 for printing an image on a photosensitive recording medium 13. As shown, the recording medium 13 is a photoconductively coated drum 14 which is rotated (by means not shown) in the direction indicated by arrow 13A. Nevertheless, it will be evident that there are other xerographic and non-xerographic recording media that could be used, including photoconductively coated belts and plates, as well as photosensitive films and coated papers. Thus, in the generalized case, the recording medium 13 should be visualized as being a photosensitive medium which is exposed while advancing in a cross line or line pitch direction relative to modulator 12.

Figure 3:
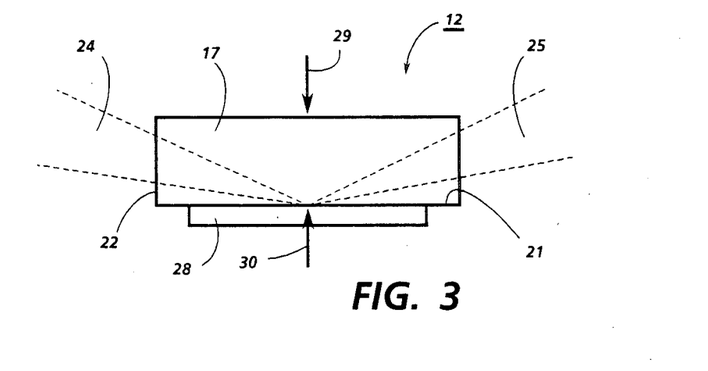
FIG. 3 is an enlarged side view of a TIR multigate line modulator.
Figure 4:
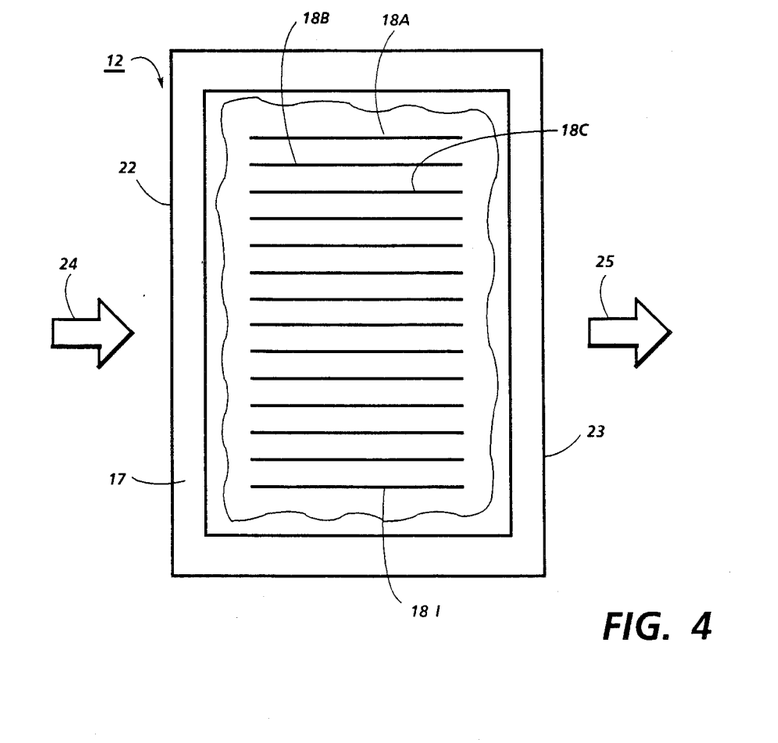
FIG. 4 is an enlarged bottom view of the modulator shown in FIG. 3 to illustrate the individually addressable electrodes of the modulator.

As best illustrated in FIGS. 3 and 4, modulator 12 comprises an optically transparent electro-optic element 17 and a plurality of individually addressable electrodes 18A–18I. The most promising electro-optic materials for such a device presently appear to be $LiNbO_3$ and $LiTaO_3$, but there are others which warrant consideration, including DSN, KDP, KDxP, $Ba_2NaNb_5O_{15}$ and PLZT. In this particular embodiment, modulator 12 is operated in a TIR mode. Thus electro-optic element 17 is suitably a y-cut crystal of, say $LiNbO_3$ having an optically polished reflecting surface 21 extending between opposed, optically polished input and output faces 22 and 23, respectively. Typically, each of the electrodes 18A–18I is 1 to 30 microns wide, and the interelectrode gap spacing is 1 to 30 microns.

Referring to FIGS. 1 through 4 for a brief view of the operation of modulator 12, it will be seen that a sheetlike collimated light beam 24 from an incoherent laser array light source 15 is transmitted, via front end optics 16, through input face 22 of electro-optic element 17 at a grazing angle of incidence relative to reflecting surface 21, i.e., an angle no greater than the critical angle of incidence for total internal reflectance from that surface.

The input beam 24 is laterally expanded by optics so that it more or less uniformly illuminates substantially the full width of the electro-optic element 17 and is brought to a wedge shaped focus 24A by optics 16 on the reflecting surface 21 approximately midway through electro-optic element 17. Accordingly, input beam 24 is totally internally reflected from reflecting surface 21 to provide an output beam 25 which exits from the electro-optic element 17 through its output face 23.

The phase front or the polarization of output beam 25 is spatially modulated in accordance with the data applied to electrodes 18A-18I. More particularly, if the data creates a voltage drop between any adjacent pair of electrodes, such as electrodes 18B and 18C, a corresponding fringe field is coupled into electro-optic element 17, thereby producing a localized variation in its refractive index. To efficiently couple such fringe fields into electro-optic element 17, electrodes 18A-18I are supported on or very near reflecting surface 21 thereof. Electrodes 18A-18I preferably are deposited on a suitable substrate, such as a VLSI silicon circuit 28, which is pressed or otherwise firmly held against electro-optic element 17, as indicated by the arrows 29 and 30, to maintain electrodes 18A-18I in contact with, or at least closely adjacent, reflecting surface 21. The advantage of this construction is that VLSI circuit 28 may be used to make the necessary electrical connections to electrodes 18A-18I. Alternatively, electrodes 18A-18I could be deposited on reflecting surface 21 of electro-optical element 17.

For illustrative purposes, it has been assumed that the phase front of the output beam 25 is spatially modulated in accordance with the data applied to electrodes 18A-18I. Accordingly, Schlieren central dark field or bright field imaging optics are used to convert the phase front modulation of the output beam 25 into a correspondingly modulated intensity profile and to supply any magnification that may be needed to obtain an image of the desired size at the surface of recording medium 13. More particularly, as shown, there is a central dark field imaging optics 31 comprising a field lens 34, a central stop 35, and an imaging lens 36. The field lens 34 is optically aligned between output face 24 of electro-optic element 17 and stop 34 to focus substantially all of the zero order diffraction components of the output beam 25 onto stop 35. However, the higher order diffraction components of output beam 25 scatter around stop 35 and are collected by imaging lens 36 which, in turn, focuses these components onto recording medium 13 to provide an intensity modulated image of modulator 12.

Referring again to FIG. 4, it will be noted that each of the electrodes 18A-18I is individually addressable. Therefore, to print an image, differentially encoded data samples for successive lines of the image are sequentially applied to electrodes 18A-18I. As a matter of definition, each differentially encoded data sample, other than the first sample for each line of the image, has a magnitude which differs from the magnitude of the previous differentially encoded sample by an amount corresponding to the magnitude of a particular input data sample. The first differentially encoded sample for each line is referenced to a predetermined potential, such as ground. Thus, when the differentially encoded data samples for any given line of the image are applied to electrodes 18A-18I, the picture elements for that line are faithfully represented by the electrode-to-electrode voltage drops at modulator 12.

To supply the differentially encoded data samples, serial input data samples representing adjacent picture elements or pixels of successive lines of an image are applied to a differential encoder at a predetermined data rate. The encoder differentially encodes these input samples on a line-by-line basis, and a multiplexor ripples the encoded data samples onto electrodes 18A-18I at a ripple rate which is matched to the data rate. The input data may be buffered to match the input data rate to any desired ripple rate.

Alternatively, a set of ground plane electrodes (i.e., not shown, but defined as being electrodes reference to the same voltage level as the raw input data samples) may be interleaved with the individually addressable electrodes, thereby avoiding the need for differential encoding. As a general rule, however, the advantages of reducing the number of electrodes required to achieve a given resolution justify the additional circuitry needed for differential encoding.

For printer 11 in the sagittal direction, optics 16 images the near field light from laser array source, which may, for example, be one quarter to one micron wide spot, onto modulator 12. This spot image is imaged down to be one diffraction limited spot wide in modulator 12. The output 25 from modulator 12 is then broadened out, for example, to a 10 micron spot for a one micron source spot. In the tangential direction, the light is collimated by the optics 16 at modulator 12 so that it is illuminated with the far field of laser array source 15.

Thus, each adjacent pair of electrodes, such as the electrodes 18B and 18C shown in FIG. 4, cooperate with electro-optic element 17 and readout optics 31 to effectively define a local modulator for creating a picture element or pixel at a unique, spatially predetermined position along each line of an image to be replicated at medium 13.

An example of the optics 16 for collimating and focussing sheetlike beam 24 to a wedge-shaped line 24A onto the surface of modulator 12 is illustrated in U.S. Pat. No. 4,638,334.

Reference is now made to the type of laser array desirable for utilization with line printer 11. In general, the emitters of the laser array must not be phased locked but have to be sufficiently closely spaced so that the far field pattern will be uniform emission pattern of the gaussian form which emitter composite pattern corresponds to the far field emission pattern of the individual laser emitters or laser elements of the array. In other words, the spatial criteria for the emitters is that they they must be spatially close enough to form a uniform far field pattern but at the same time not provide phase locking between adjacent emitters. This is a difficult situation because, as the prior art will testify to, phase-lockig occurs when the spacing of emitters is close. But if the emitter separation is increased to an extent to eliminate stable phaselocking, the far field emission pattern will not be uniform due to the large distance between emitters and there will remain far field lobes and irregularities preventing uniformity across the far field pattern.

Figure 5:
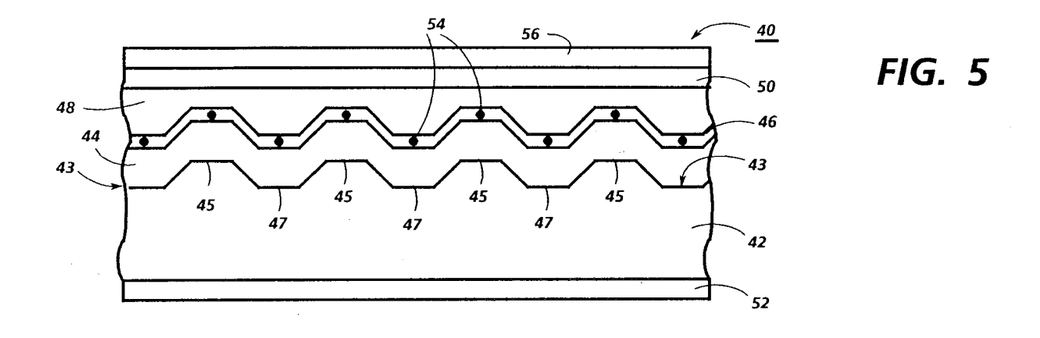
FIG. 5 is a schematic illustration of an incoherent laser array for use with the printer shown in FIG. 1.

Thus, it is necessary to introduce some mechanism or means by which the emitters may be sufficiently closely spaced but not phaselocked, i.e., remain incoherent relative to one another and the net optical intensity in the far field is the added effect of the optical intensities of the individual emitters. The mechanism or means may be in the form of either lateral displacement of the emitters in their geometry or isolation imposed between the individual emitters for an index guided laser array structure. An example of lateral emitter displacement is illustrated in FIG. 5. An example of optical isolation is illustrated in FIG. 6.

FIG. 5 illustrates incoherent laser array 40 having a plurality of closely spaced laser elements which are formed by incorporating offset laser element geometry. In FIG. 5, the individual emitters are optically uncoupled in the array, therefore, not phaselocked by displacing each laser element in the vertical and lateral directions. The structure for laser array 40 may comprise, for example, a substrate 42 of n-GaAs which is selectively etched by conventional techniques to provide the periodic structure 43 of alternating mesas 45 and channels 47. Then, metal-organic chemical vapor deposition (MO-CVD) growth techniques are utilized to epitaxially grow semiconductor layers 44-48. The layers relevant to the laser structure are: cladding layer 44 of n-Ga$_{1-x}$Al$_x$As where x may be 0.4; active region 46 which may be comprised of a single active layer or a single quantum well structure or a multiple quantum well structure; a cladding layer 48 of n-Ga$_{1-x}$Al$_x$As where x may be 0.4; and a cap layer of p+-GaAs. Laser array 40 may be provided with appropriate proton or ion implant to provide for enhanced current confinement to the regions of the individual emitters 54 and further provided with a Cr-Au or Ti-Pt-Au metalization 56 on cap layer 70 and an alloyed Au-Ge layer, followed by a Cr-Au or Ti-Pt-Au metalization 52 on the bottom surface of substrate 42.

The lateral separation of individual laser emitters 54 in this nonplanar array can be made dimensionally less thin compared to a planar array of emitters because the optical field of each emitter in the vertical direction is very tightly confined by the strong optical waveguide formed by the periodic structure 43 and propagated through layers 44-48. For example, a lateral displacement of 2 to 3, $\mu$m between the laser cavities represented by emitters 54 is adequate to eliminate optical coupling between adjacent laser elements and yet permit closer lateral or horizontal spacing than would be possible in a planar array. Also, the closer spacing using the displacement geometry of laser array 40 utilizes more efficiently the applied pumping current to the array. The minimum lateral separation of the laser emitters will depend upon the vertical plane separation but can be made less than 10 $\mu$m.

Figure 6:
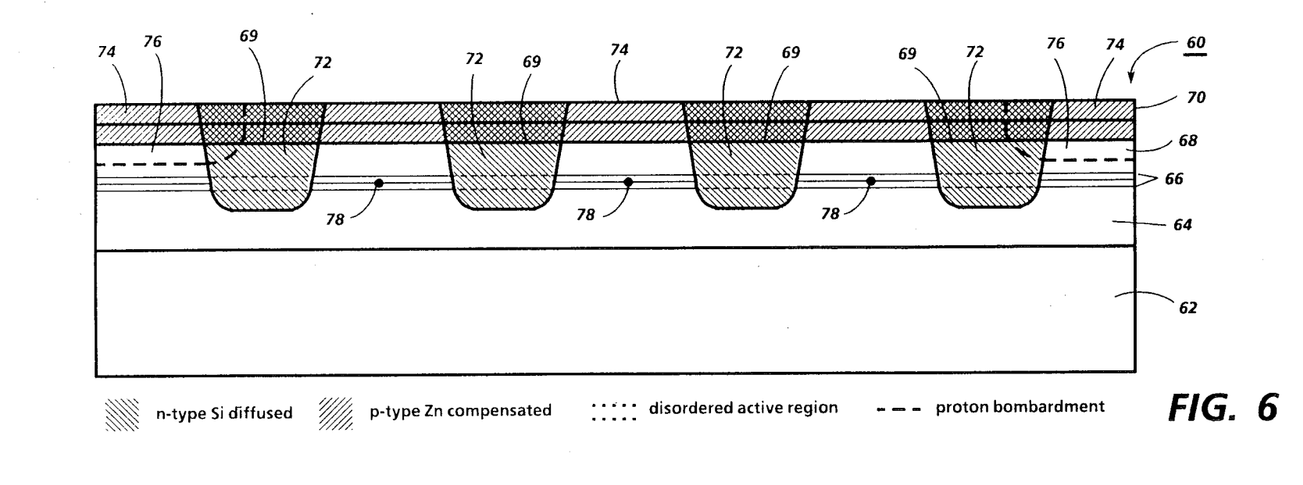
FIG. 6 is a schematic illustration of another incoherent laser array for use with the printer shown in FIG. 1.

FIG. 6 illustrates incoherent laser array 70 having a plurality of closely spaced laser elements is formed with impurity induced disordering (IID). Only three laser emitters 78 are shown for the sake of expediency and simplicity, but obviously there may be multiple emitters formed.

Laser array 60 comprises a n-GaAs substrate 62 upon which are epitaxially deposited the following layers: cladding layer 64 of n-Ga$_{1-x}$Al$_x$As where x may, for example, by equal to 0.4 and the layer may be about 1.5 $\mu$m thick; active region 66 comprising an active layer or a single quantum well structure or a multiple quantum well structure, for example, GaAs four quantum well layers each 10 nm thick separated by barrier Ga$_{0.65}$Al$_{0.35}$As layers each 7 nm thick; cladding layer 68 of p-Ga$_{1-x}$Al$_x$As where x may, for example, be equal to 0.4 and the layer may be about 0.8 $\mu$m thick; and cap layer of p+-GaAs being about 0.1 $\mu$m thick. The active region may be p doped, n doped or undoped.

In order to form the IID n-type regions 72 shown in FIG. 6, an array of diffusion windows are patterned into a Si$_3$N$_4$ film deposited on cap layer 72, followed by the deposition of a silicon film to serve as the source of silicon for the diffusion process. The processing of laser array 70 begins with the deposition of a film of Si$_3$N$_4$ of about 100 nm thick. This film is photolithographically patterned to provide windows or openings for forming regions 72 via Si duffusion. Next, an approximately 50 nm thick film of silicon is deposited on the array, followed by another film of Si$_3$N$_4$ of approximately 100 nm thickness. Diffusion is performed at 850° C. for 7.5 hours to disorder the active region in areas adjacent to what will eventually become the lasing filaments as represented by emitters 78.

The n-type Si diffusion regions are shown as crosshatched regions 72 extending through active region 66. It is preferred that the diffusion extend through the active layer and any layers that form a part of or function as part of the optical cavity of each laser element. In this regard, the diffusion may be best to extend partly into lower cladding layer 64 depending, for example, upon the percentage of aluminum in the inner cladding layer. If additional inner confinement layers are provided with the active region, it is preferred that the diffusion extend through such confinement layers since they are part of the laser element optical cavity. The result to be realized is that the diffusion must extend sufficiently through the optical cavity of each laser element to prevent stable phase locking between adjacent emitters due to overlap of evanescent optical wave extending between adjacent cavities. The diffusion regions 72 provide both optical confinement of this wave as well as carrier confinement to the individual laser cavities represented by the emitters 78 so that the individual laser elements may be closely spaced, such as on 4-10 $\mu$m centers, without being optically coupled to one another.

After the diffusion, the Si layer and both Si$_3$N$_4$ layers are removed by etching in a CF$_4$ plasma. The entire surface of array 60 is then Zn-diffused, as indicated by the crosshatched area 74, to reconvert the n-type Si-diffused GaAs cap layer 70 and part of cladding layer 68 to p-type material. It is important that the Zn-diffusion penetrate into cladding layer 68, because of the properties of the resulting parasitic pn-junction 69 that is in parallel with the active region lasing junction. As a result, of the Zn diffusion, this parasitic junction 69 lies in a high aluminum cladding layer 68, which junction has a much higher turn-on voltage than that of the GaAs active region 66. Since the bandgap of the material at junction 69 is significantly higher than at the active region GaAs junction, this junction conducts significantly less current at a given junction voltage than the lasing junction in the active region. Therefore, the leakage current through the high aluminum junction 69 is only a very small fraction of the total current through the array device and does not significantly degrade device performance.

Finally, a relatively broad mask is aligned to cover a little more than midway of the outer two diffusion regions 72 of the device and a proton bombardment isolation is performed on the outlying regions of the array 60. This isolation is represented by the dotted lines in FIG. 6 forming isolation regions 76. The purpose of this implant is to prevent current flow in the outlying regions 76 that have not been previously disordered by the silicon duffusion. To accomplish this, the implant need only fall somewhere within the outer Si disordered regions and the alignment of the implant mask is not, therefore, critical.

After proton implantion at an energy of 70 keV with a dose of $3 \times 10^{15}$, laser array 60 is metallized with Cr-Au or Ti-Pt-Au on cap layer 70 and alloyed with Au-Ge, followed by Cr-Au or Ti-Pt-Au on the bottom surface of substrate 62.

A $\lambda/2$ $Al_2O_3$ layer may be deposited on the front facet of laser array 60 for passivation. A six-layer multilayer stack of $Al_2O_3$-Si $\lambda/4$ layer-pairs may be deposited on the rear facet to increase its reflectivity to approximately 95% and thereby reduce the lasing threshold of the device by approximately 20-30%.

It has been demonstrated in the past that several different diffused species may produce the IID effect. For example, disordering is possible also with Zn, Ge, Sn and S. Also, disordering is possible through implantation of elements acting as shallow or deep level impurities, such as Se, Mg, Sn, O, S, Be, Te, SI, Mn, Zn, Cd, Ln, Cr or Kr, followed by a high temperature anneal best performed in an As environment.

For laser devices, disordering by both zinc and silicon disordering via their diffusion have been successfully accomplished and there has been considerable interest in the lower thresholds ultimately attainable in these devices. Since devices utilizing IID have very strong lateral confinement of carriers, the threshold currents are limited primarily by the width of the laser contact stripes that one is able to achieve in the photolithographic process and maintain in the diffusion process. In previously fabricated IID laser structures, device geometry required that the contact mask be aligned to a dimension smaller than the width of the lasing filament, while avoiding contacting of the diffused region adjacent to the active region. Therefore, if a very narrow lasing filament for each laser emitter is desired, e.g. 2 $\mu$m width, the width of the lasing stripe becomes limited by the minimum diffusion window opening width achievable and the associated alignment tolerance. This problem is further compounded when it is desired to make a multiple emitter laser array of the type desired herein, where it is highly desirable to have the emitters closely spaced without establishing phase locking. However, a novel feature of laser array 60 is the concept of completely submerging the n-type diffusion with the p-type compensation across the entire width of the array device, allowing a single broad area surface contact to be used to pump the entire array. Using this technique, it is possible to successfully reduce the emitter width to about 2 $\mu$m or less with 6 $\mu$m spacing, resulting, for example, in the fabrication of a ten emitter laser array 60 with a current threshold of about 53 mA and with a power output of up to 250 mW CW or more.

It can be seen, then, that close spacing of lasing elements of the array can be achieved without phase locking or optical coupling to form a broad uniform far field pattern best suited for electro-optic line modulators and printers and also providing low operating current thresholds and with accompanying lower heat generation compared to LED super luminescent devices of comparable output power.

The advantages of the incoherent laser array of this invention compared to the super luminescent LED are several: First, there are no extra lobes appearing in the far field pattern. Secondly, there is reduced speckle pattern in the far field because without optical coupling there is an additive effect of the different speckle patterns of the individual laser elements of the array so that their combined effect in the far field is a high level of uniform intensity in the far field pattern. Third, the current threshold at about 50mA clearly demonstrates the significant reduction of heating problems. Fourth, the laser array has higher efficiency than the super luminescent LED of about 20-40% or more. Fifth, the laser array due to its lower current/temperature operating characteristics, provides a wide range of power availability for various light source input requirements of different types of electro-optic line modulators and line printers.

Figure 7:
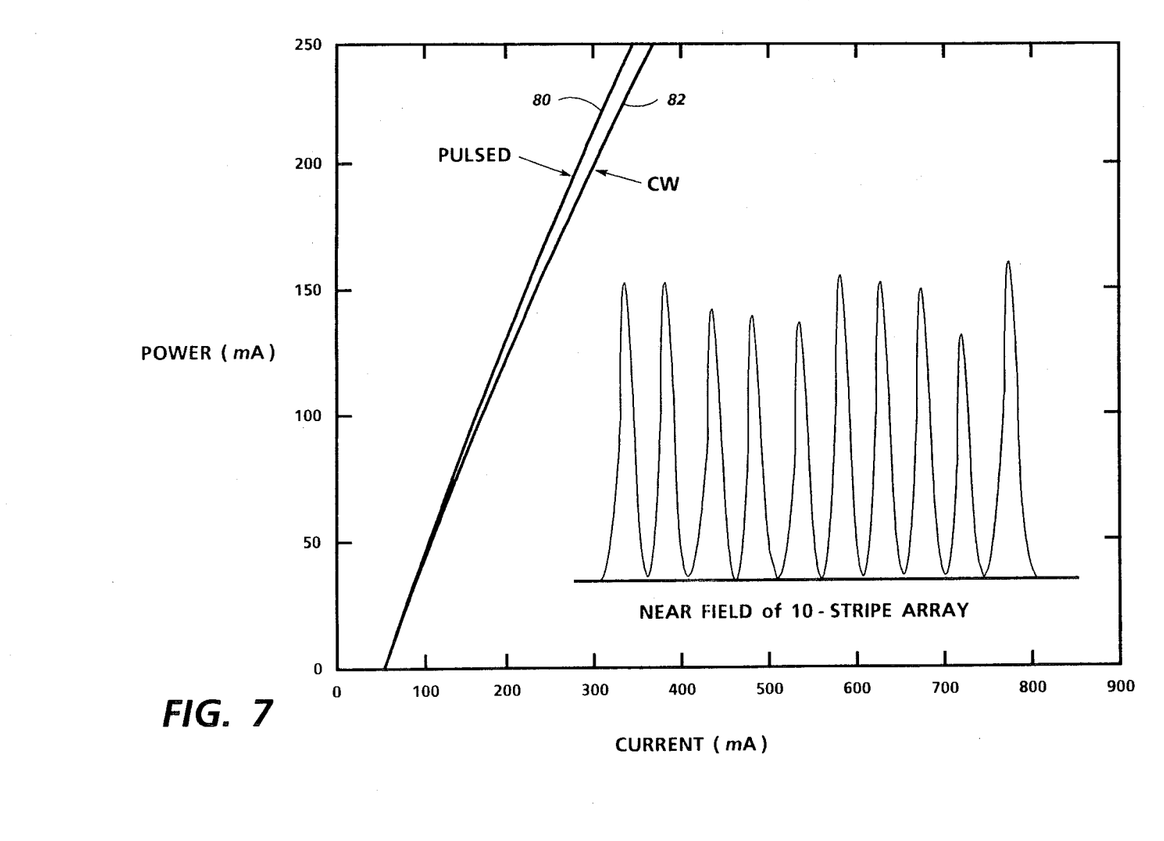
FIG. 7 is a graphic illustration of the pulsed and CW power versus current characteristics for the laser array shown in FIG. 6 with the inset illustrating the near field profile at 100 mA drive current.
Figure 8:
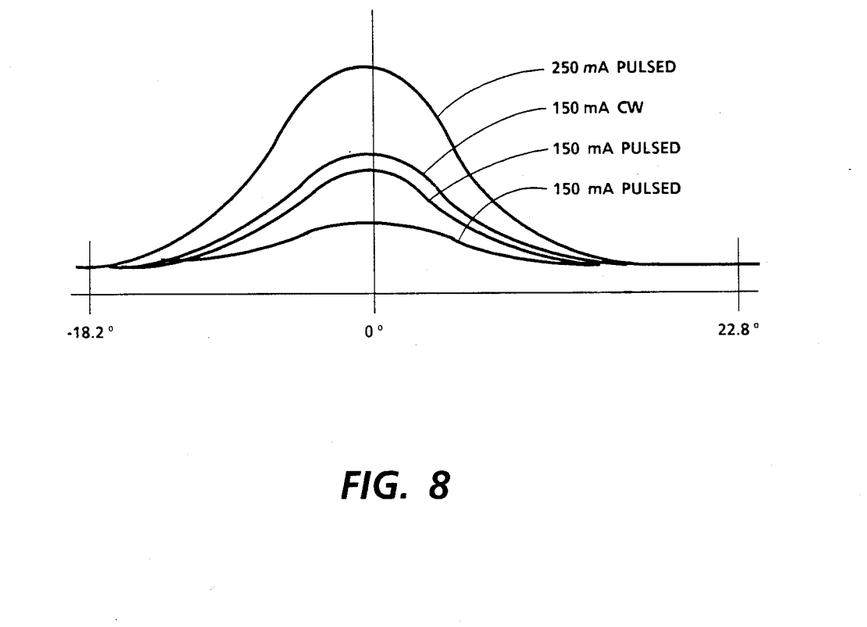
FIG. 8 is a graphic illustration of the far field emission characteristics for the laser array shown in FIG. 6.

FIGS. 7 and 8 illustrate the power versus current output characteristics and the near field and far field patterns of a multiple emitter laser array 60 having the multiple quantum well structure as previously described relative to FIG. 5 and provided with 2 $\mu$m wide emitters 78 with spacing between the emitters being 6 $\mu$m. The lasing threshold for this array is 53 mA. The pulsed power versus current curve 80 in FIG. 7 gives a differential quantum efficiency of 62%. With a measured series resistance of 1.3 $\Omega$, the total power conversion efficiency at 250 mW is 43%. These high efficiency numbers provide evidence that the lasing filaments waveguides have relatively little loss introduced by the Si diffusion process. Also, it is clear from the near field pattern in the inset of FIG. 7 that the lateral optical confinement is strong, as evidence by the fact that the emitters have clearly resolved nulls separation them. Also to be noted is the high degree of uniformity between the ten individual emitters comprising the array.

In FIG. 8, the uniform broad far field patterns for 100, 150 and 250 mA pulsed operation and 150 mA CW operation show that there remains incoherent operation among the separate emitters for increasing applied input without phase locking, as illustrated by the aligned gaussian profiles. The emitters 78 are closely spaced to within 6 $\mu$m without exhibiting any phased locked condition under different applied currents.

Other alloy systems may be used to fabricate the laser arrays utilized herein with visible emission wavelengths, e.g., InGaP/InGaAsP/InGaP or AlGaInP/InGaP/AlGaInP.

Also, the doping type of the laser array layers may be obviously reversed with p-type IID regions 72. Further, transparent window may be formed at the output face of the laser array by thermally annealing the quantum well active region over a small region near the laser output facet in order to shift its absorption to a higher energy.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. An incoherent, optically uncoupled laser array for an electro-optic line modulator or a line printer or the like, said array comprising a plurality of spatial laser emitters and characterized by having high power density and a uniform far field emission pattern, the improvement comprising index waveguide means formed between said spatial laser emitters to reduce the strength of evanescent field of said laser emitters from extending into adjacent emitters below a level required for accomplishing stable phase locking among said laser emitters to produce a broad output intensity envelope in the far field of substantially Gaussian profile with corresponding aligned Gaussian profiles with increasing applied input to said array without incurring emitter phase locking, said index waveguide means comprises a plurality of spatially disposed isolation regions extending across said laser array and extending into said laser array a distance sufficient to optically isolate said laser emitters from one another and to permit close physical spacing of said laser emitters at 6 $\mu$m center-to-center spacing or less.

2. The incoherent, optically uncoupled laser array of claim 1 wherein said array includes an active region, said optically isolating means comprises impurity induced disordered regions extending into said laser array through said active region to optically isolate said laser emitter from one another.

3. The incoherent, optically uncoupled laser array of claim 2 wherein said regions extend at least into the active region of each of said laser emitters.

4. In an electro-optic line printer comprising a recording medium, an electro-optic line modulator for presenting picture elements in spatially predetermined positions along a printing line laterally of said recording medium and having an optically transmissive electro-optic element and a plurality of spaced, addressable electrodes disposed on one side of said electro-optic element forming at the interface with said element an interactive region, means for advancing said recording medium at a predetermined rate in a cross line direction relative to said printing line, an incoherent, optically uncoupled laser array comprising a plurality of spatial laser emitters and productive of an output beam characterized by having high power density and a uniform far field emission pattern, index waveguide means formed between said spatial laser emitters to reduce the strength of evanescent field of said laser emitters from extending into adjacent emitters below a level required for accomplishing stable phase locking among said laser emitters to provide a broad output intensity envelope in the far field of substantially Gaussian profile with corresponding aligned Gaussian profiles with increasing applied input to said array without incurring emitter phase locking, first optical means for applying said beam from said array in a sheetlike line beam into said interactive region of said modulator, and second optical means aligned between said modulator and said recording medium for imaging said light beam from said modulator onto said recording medium.

5. The electro-optic line printer of claim 4 wherein said index waveguide means comprises spatially positioned optical isolation regions formed by impurity induced disordering of said regions

* * * * *